(12) United States Patent
Yang et al.

(10) Patent No.: US 6,960,804 B1
(45) Date of Patent: Nov. 1, 2005

(54) SEMICONDUCTOR DEVICE HAVING A GATE STRUCTURE SURROUNDING A FIN

(75) Inventors: Chih-Yuh Yang, San Jose, CA (US); Shibly S. Ahmed, San Jose, CA (US); Judy Xilin An, San Jose, CA (US); Srikanteswara Dakshina-Murthy, Austin, TX (US); Bin Yu, Cupertino, CA (US)

(73) Assignee: Hussman Corporation, Bridgeton, MO (US)

(*) Notice: Subject to any disclaimer, the term of this patent is extended or adjusted under 35 U.S.C. 154(b) by 169 days.

(21) Appl. No.: 10/633,034

(22) Filed: Oct. 10, 2003

(51) Int. Cl.⁷ .......................................... H01L 29/788
(52) U.S. Cl. ..................... 257/315; 257/316; 257/406
(58) Field of Search ................................ 257/347–355, 257/315–316, 406

(56) References Cited

U.S. PATENT DOCUMENTS

| | | | |
|---|---|---|---|
| 6,525,403 B2 | 2/2003 | Inaba et al. | 257/618 |
| 6,764,884 B1 * | 7/2004 | Yu et al. | 438/157 |
| 6,768,158 B2 * | 7/2004 | Lee et al. | 257/315 |
| 6,812,119 B1 | 11/2004 | Ahmed et al. | 438/585 |
| 2003/0042531 A1 | 3/2003 | Lee et al. | |
| 2003/0113970 A1 | 6/2003 | Fried et al. | |
| 2004/0075121 A1 | 4/2004 | Yu et al. | 257/288 |

OTHER PUBLICATIONS

Digh Hisamoto et al., "FinFET–A Self–Aligned DoubleGate MOSFET Scalable to 200 nm," IEEE Transactions on Electron Devices, vol. 47, No. 12, Dec. 2000, pp. 2320–2325.

Yang–Kyu Choi et al., "Sub–20nm CMOS FinFET Technologies," 2001 IEEE, IEDM, pp. 421–424.

Xuejue Huang et al., "Sub–50 nm P–Channel FinFet," IEEE Transactions on Electron Devices, vol. 48, No. 5, May 2001, pp. 880–886.

Xuejue Huang et al., "Sub 50–nm FinFET: PMOS," 1999 IEEE, IEDM, pp. 67–70.

Yang–Kyu Choi et al., "Nanoscale CMOS Spacer FinFET for the Terabit Era," IEEE Electron Device Letters, vol. 23, No. 1, Jan. 2002, pp. 25–27.

Co–pending U.S. Appl. No. 10/348,758 filed Jan. 23, 2003 entitled "Germanium Mosfet Devices and Methods for Making Same," Judy Xilin An et al., 22 page specification, 29 sheets of drawings.

* cited by examiner

Primary Examiner—Fetsum Abraham
(74) Attorney, Agent, or Firm—Michael Best & Friedrich LLP

(57) ABSTRACT

A double-semiconductor device includes a substrate, an insulating layer, a fin and a gate. The insulating layer is formed on the substrate and the fin is formed on the insulating layer. The fin has a number of side surfaces, a top surface and a bottom surface. The gate is formed on the insulating layer and surrounds the top surface, bottom surface and the side surfaces of the fin in the channel region of the semiconductor device. Surrounding the fin with gate material results in an increased total channel width and more flexible device adjustment margins.

18 Claims, 22 Drawing Sheets

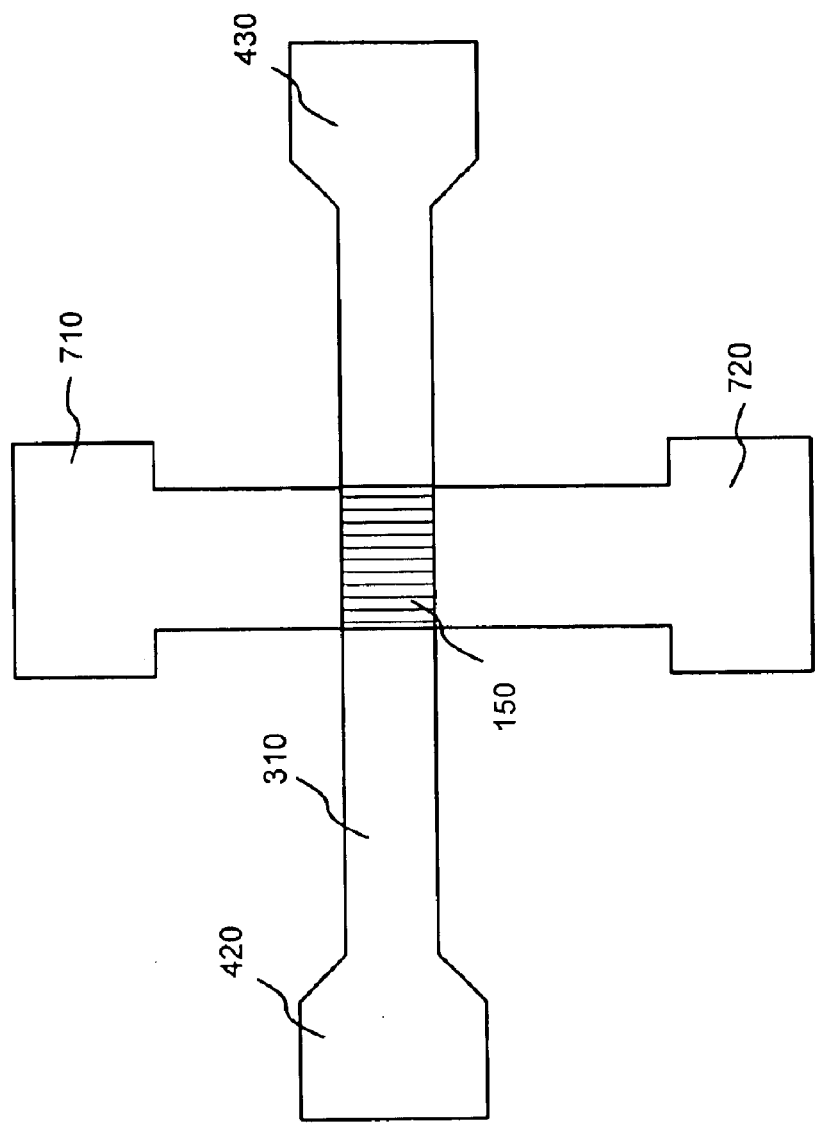

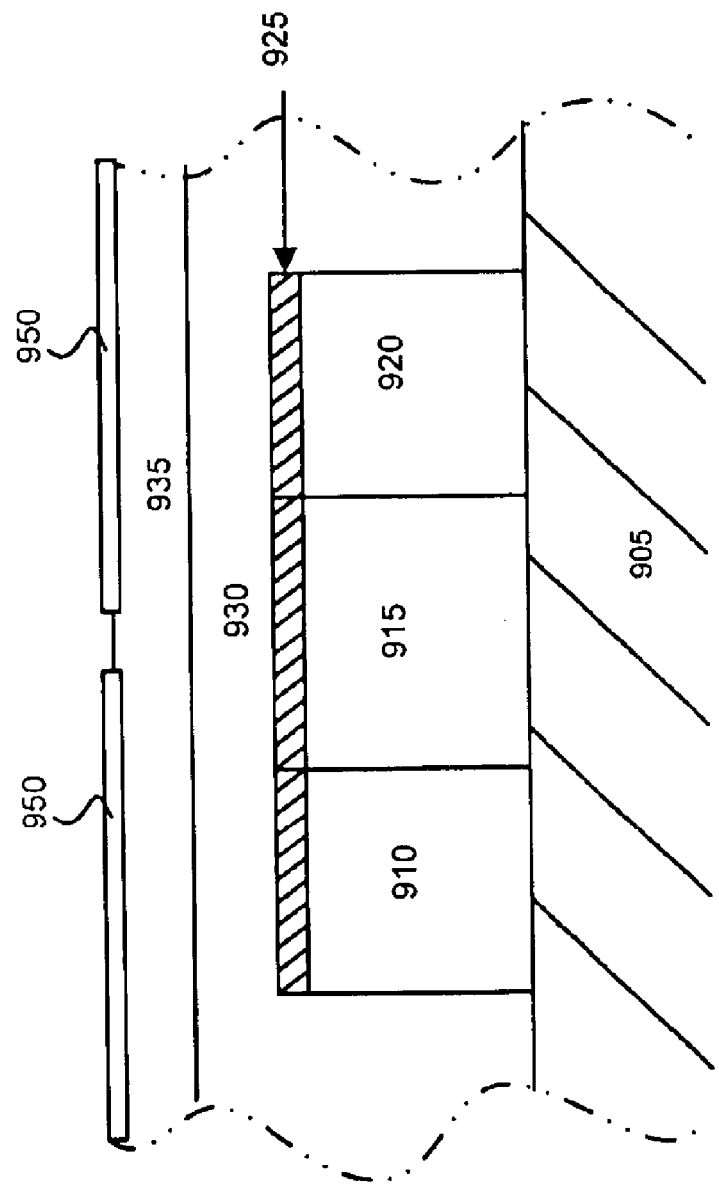

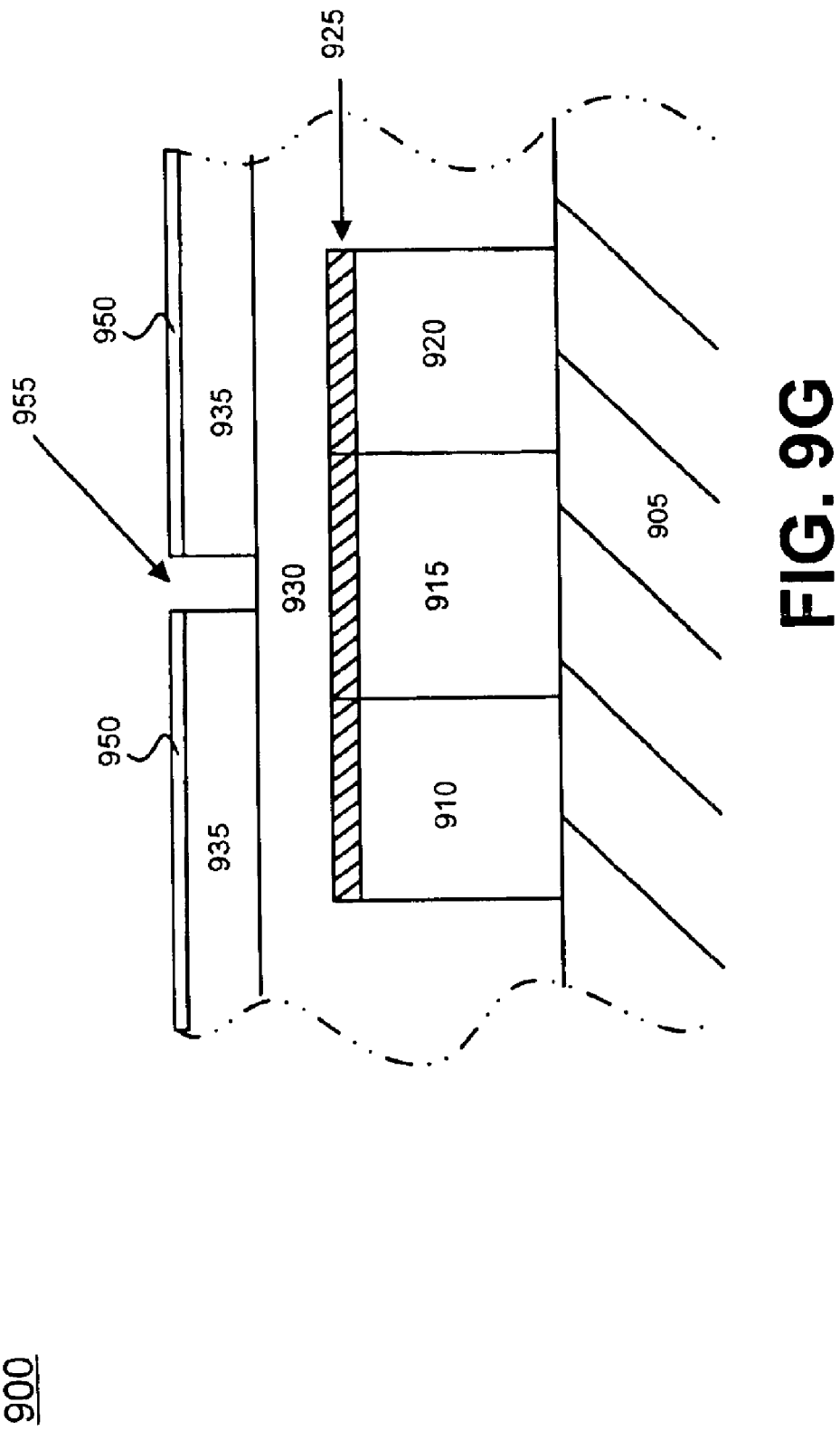

SEMICONDUCTOR DEVICE HAVING A GATE STRUCTURE SURROUNDING A FIN

TECHNICAL FIELD

The present invention relates to semiconductor devices and methods of manufacturing semiconductor devices. The present invention has particular applicability to double-gate device.

BACKGROUND ART

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In double-gate MOSFETs, two gates may be used to control short channel effects. A FinFET is a recent double-gate structure that exhibits good short channel behavior. A FinFET includes a channel formed in a vertical fin. The FinFET structure may also be fabricated using layout and process techniques similar to those used for conventional planar MOSFETs.

DISCLOSURE OF THE INVENTION

Implementations consistent with the present invention provide a FinFET device with a gate structure that surrounds a conductive fin. By having gate material surround the fin, the FinFET device has an increased total channel width as compared to conventional FinFET devices.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to the present invention, the foregoing and other advantages are achieved in part by a semiconductor device that includes a substrate, an insulating layer, a fin and a gate. The insulating layer is formed on the substrate and the fin is formed on the insulating layer. The fin has a plurality of side surfaces, a top surface and a bottom surface. The gate is formed on the insulating layer and surrounds the plurality of side surfaces, the top surface and the bottom surface of the fin at a channel region of the semiconductor device.

According to another aspect of the invention, a method of manufacturing a semiconductor device is provided. The method includes forming at least one dielectric layer over a silicon on insulator (SOI) wafer, where the SOI wafer includes a conductive layer on an insulating layer that is formed on a substrate. The method also includes forming a mask over the at least one dielectric layer, etching the at least one dielectric layer and etching a portion of the conductive layer to form a fin structure. The fin structure has a plurality of side surfaces, a top surface and a bottom surface, where a lower portion of the fin structure has a narrower width than a top portion of the fin structure. The method further includes etching a remaining portion of the conductive layer to laterally undercut the conductive layer located below the fin structure, forming a gate dielectric on the plurality of side surfaces and bottom surface of the fin structure and depositing a gate material over the fin structure. The gate material surrounds the plurality of side surfaces, the top surface and the bottom surface of the fin structure. The method also includes patterning and etching the gate material to form a gate electrode, where the gate electrode surrounds the plurality of side surfaces, the top surface and the bottom surface of the fin structure in a channel region of the semiconductor device.

According to a further aspect of the invention, a semiconductor device that includes a substrate, an insulating layer, a conductive fin, at least one dielectric layer, a gate dielectric layer and a gate is provided. The insulating layer is disposed on the substrate and a conductive fin is formed on the insulating layer. The conductive fin has a first end, a second end and a middle portion located between the first and second ends, where the first and second ends are disposed on the insulating layer and the middle portion is separated from the insulating layer. The at least one dielectric layer is formed over a top surface of the conductive fin and the gate dielectric layer is formed on side surfaces and a bottom surface of the conductive fin. The gate is formed on the insulating layer and surrounds the gate dielectric layer formed on the side surfaces and bottom surface at the middle portion of the conductive fin. The gate also covers the at least one dielectric layer formed over the top surface at the middle portion of the conductive fin.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIG. 8B is a top view illustrating an exemplary double-gate device formed in accordance with the embodiment illustrated in FIG. 8A.

FIGS. 9A–9K are exemplary cross-sections and top views illustrating the formation of a damascene gate in accordance with another embodiment of the present invention.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the present invention provide FinFET devices and methods of manufacturing such devices. The FinFET devices formed in accordance with the present invention include a fin that is surrounded by gate material. The resulting FinFET devices have increased channel width as compared to conventional FinFET devices.

Figure 1:
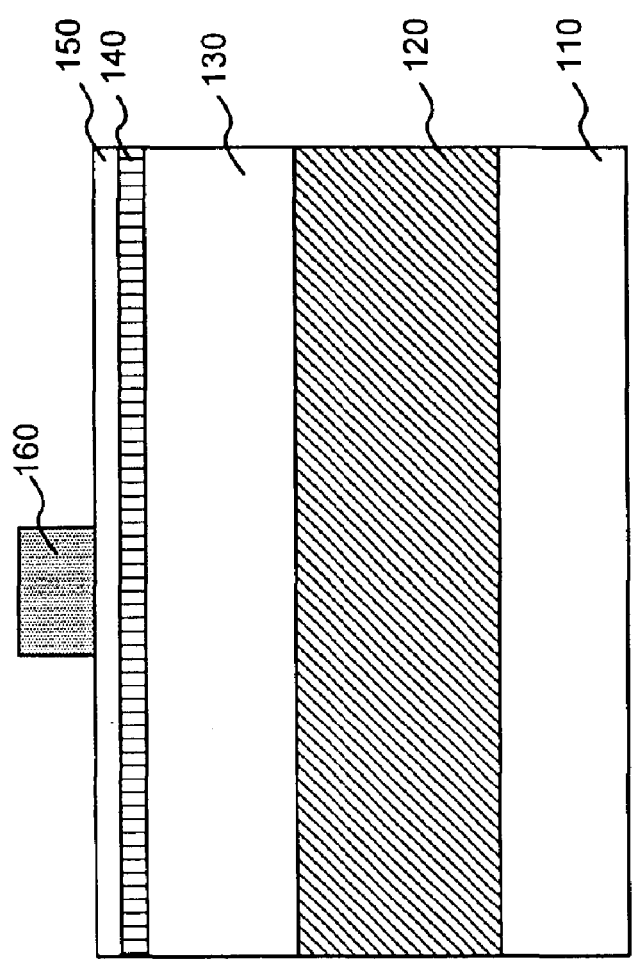
FIG. 1 is a cross-section illustrating exemplary layers that may be used for forming a fin in accordance with an embodiment of the present invention.

FIG. 1 illustrates the cross-section of a semiconductor device 100 formed in accordance with an exemplary embodiment of the present invention. Referring to FIG. 1, semiconductor device 100 may include a silicon on insulator (SOI) structure that includes a silicon substrate 110, a buried oxide layer 120 and a silicon layer 130 on the buried oxide layer 120. Buried oxide layer 120 and silicon. layer 130 may be formed on substrate 110 in a conventional manner.

In an exemplary implementation, buried oxide layer 120 may include a silicon oxide and may have a thickness ranging from about 1500 Å to about 3000 Å. Silicon layer 130 may include monocrystalline or polycrystalline silicon having a thickness ranging from about 200 Å to about 1000 Å. Silicon layer 130 is used to form a fin for a FinFET device, as described in more detail below.

In alternative implementations consistent with the present invention, substrate 110 and layer 130 may comprise other semiconducting materials, such as germanium, or combinations of semiconducting materials, such as silicon-germanium. Buried oxide layer 120 may also include other dielectric materials.

A dielectric layer 140, such as a silicon oxide layer (e.g., $SiO_2$), may be formed over silicon layer 130, as illustrated in FIG. 1. Dielectric layer 140 may act as part of a gate oxide for a subsequently formed gate and/or as a protective cap to protect the subsequently formed fin during various etching processes. In an exemplary implementation, dielectric layer 140 may be deposited at a thickness ranging from about 20 Å to about 400 Å.

Next, another dielectric layer 150, such as a silicon nitride layer (e.g., SiN or $Si_3N_4$), may be formed over dielectric layer 140, as illustrated in FIG. 1. Dielectric layer 150 may act as an anti-reflective coating (ARC) layer to reduce reflections during subsequent lithography and/or as a protective cap to protect the subsequently formed fin. In an exemplary implementation, dielectric layer 150 may be deposited at a thickness ranging from about 100 Å to about 800 Å.

Next, a photoresist material may be deposited and patterned to form a photoresist mask 160 for subsequent processing, as illustrated in FIG. 1. The photoresist may be deposited and patterned in any conventional manner. In an exemplary implementation, the photoresist mask 160 may be trimmed to a small width, such as about 100 Å to about 1000 Å. This will enable the subsequently formed fin to achieve a small line width.

Source and drain regions may also be formed in silicon layer 130. For example, silicon layer 130 may be patterned and etched in a conventional manner to form source and drain regions on buried oxide layer 120 adjacent the area in which the fin will be formed. Alternatively, the source/drain regions may be formed by depositing and patterning a layer of silicon, germanium or combination of silicon and germanium after the fin structure is formed.

In either case, semiconductor device 100 illustrated in FIG. 1 may be etched. In an exemplary implementation, dielectric layers 150 and 140 may be etched to expose the portion of silicon layer 130 not located below the photoresist mask 160. An etch chemistry using, for example, $CF_4$, may be used to etch dielectric layers 150 and 140. The particular flow rates, power ranges, bias voltages, etch duration and other parameters associated with etching dielectric layers 150 and 140 may be optimized based on the thicknesses of these layers.

Figure 2:
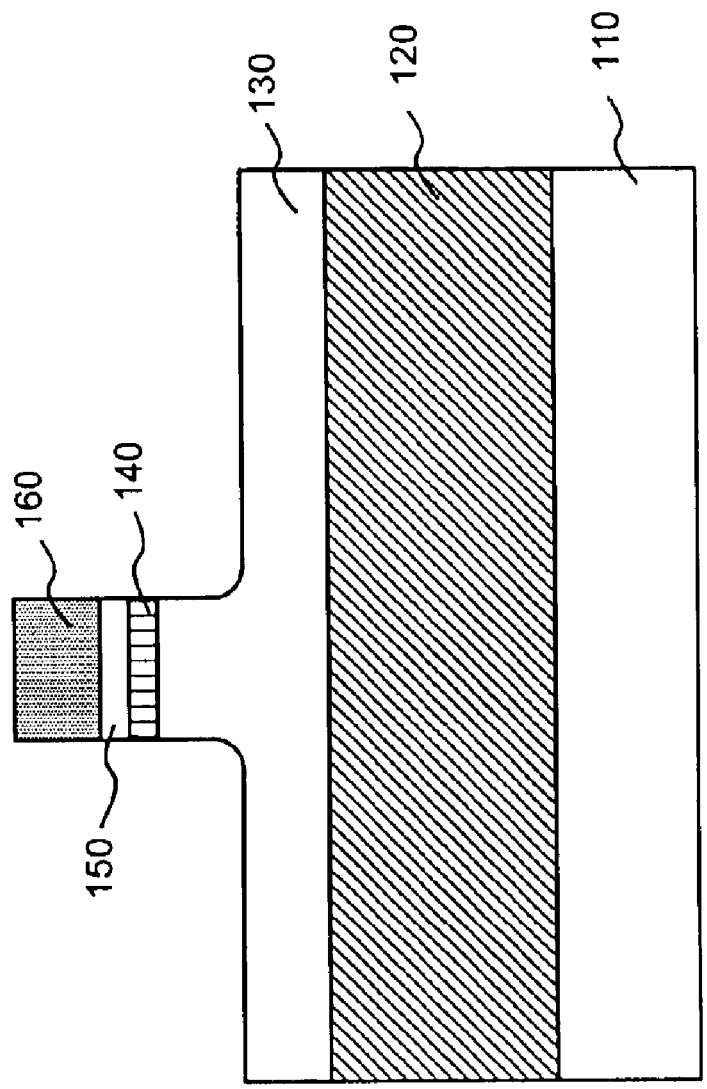
FIG. 2 is a cross-section illustrating the etching of the semiconductor device of FIG. 1 in accordance with an exemplary embodiment of the present invention.

Silicon layer 130 may then be etched to remove an upper portion of silicon layer 130 not located under photoresist mask 160, as illustrated in FIG. 2. In an exemplary implementation consistent with the present invention, a $Cl_2$/HBr etch chemistry may be used to remove about 150 Å to about 850 Å of the upper portion of silicon layer 130. The particular flow rates, power ranges, bias voltages, etch duration and other parameters associated with etching a portion of silicon layer 130 may be optimized based on the thickness of silicon layer 130. During the etching of silicon layer 130, the profile of the un-etched portion of silicon layer 130 located below photoresist mask 160 remains relatively straight in the vertical direction, as illustrated in FIG. 2.

Figure 3:
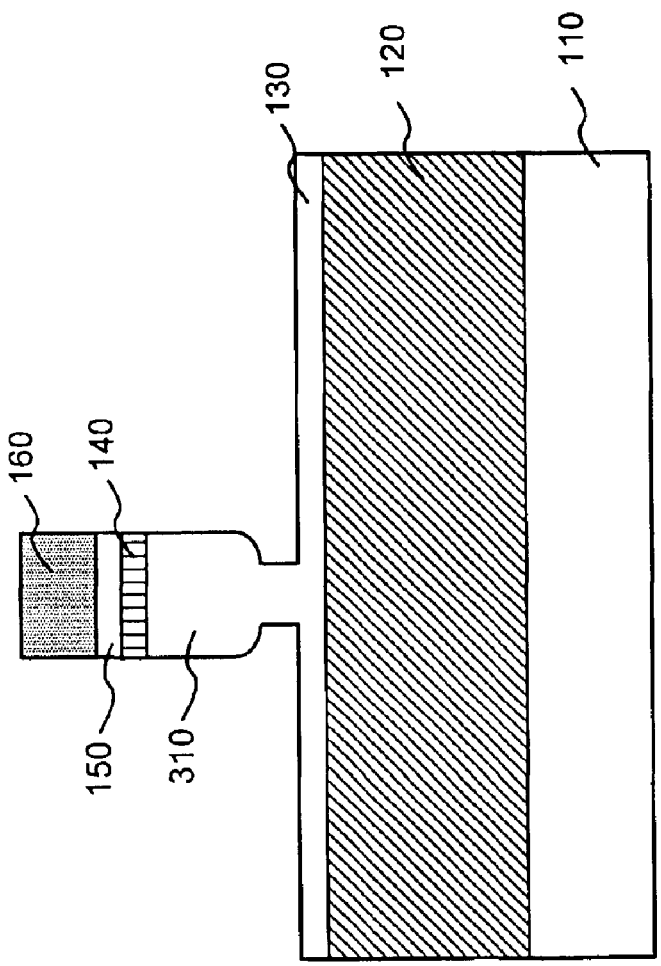
FIG. 3 is a cross-section illustrating the etching of the semiconductor device of FIG. 2 to form a fin in accordance with an exemplary embodiment of the present invention.

Next, an isotropic etch of silicon layer 130 may be performed to form fin structure 310, as illustrated in FIG. 3. Referring to FIG. 3, fin structure 310 may be narrower at its lower portion than at its upper portion. That is, during the etching, a portion of silicon layer 130 located below photoresist mask 160 may be removed, thereby laterally undercutting the lower portion of fin 310. In an exemplary implementation consistent with the present invention, the width of fin 310 at its lower portion may be as small as about 50–500 Å after the etching. In addition, after the etching, the remaining portion of silicon layer 130 may be reduced to a thickness ranging from about 50 Å to about 800 Å.

The particular etch chemistry, gas flow rates, power ranges, bias voltages, etch duration and other parameters associated with etching silicon layer 130 may be optimized based on the thickness of silicon layer 130 and the particular end device requirements. In an exemplary implementation, the isotropic etch may use a $Cl_2$/HBr etch chemistry.

Figure 4A:
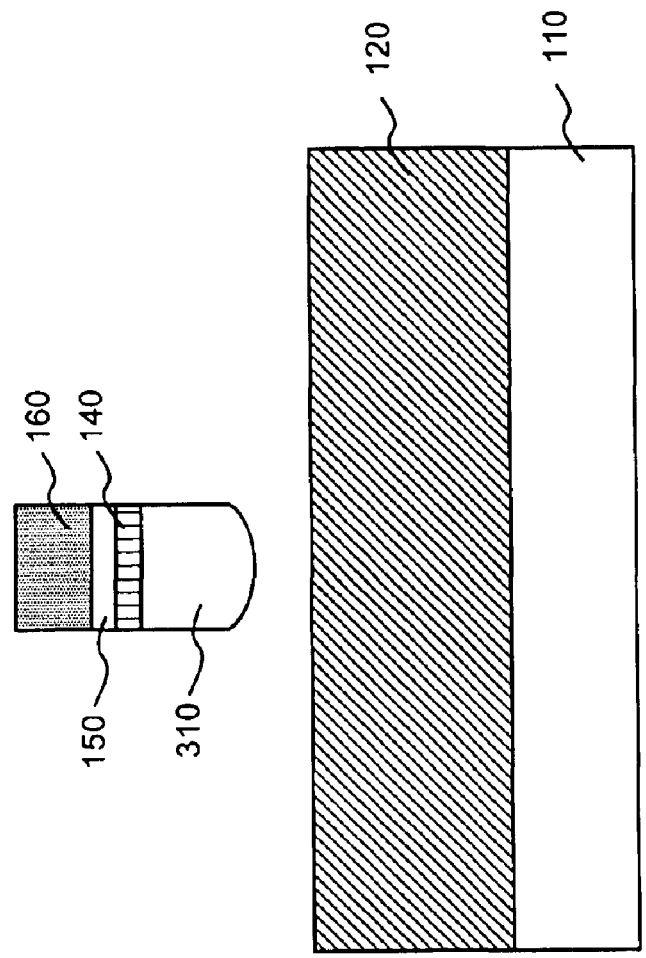
FIG. 4A is a cross-section illustrating undercutting of a conductive layer below the fin of FIG. 3 in accordance with an exemplary embodiment of the present invention.

Another etching may then be performed to remove the remaining portion of silicon layer 130 and to laterally etch through the lower portion of silicon fin 310, as illustrated in FIG. 4A. For example, an isotropic etch using HBr at a high pressure (e.g., about 100 mTorr) may be performed to remove the remaining portion of silicon layer 130 and to laterally etch through the lower portion of silicon fin 310. The particular gas flow rates, power ranges, bias voltages, etch duration and other parameters associated with etching silicon layer 130 may be optimized based on the thickness of the remaining portion of silicon layer 130 and the particular end device requirements. During this etching, a small portion of buried oxide layer 120 may also be removed.

Referring to FIG. 4A, fin 310 is effectively suspended above buried oxide layer 120 in the cross-section illustrated in FIG. 4A. This cross-section illustrates the channel region of the semiconductor device 100. The end portions of fin 310, however, are still attached to the buried oxide layer 120 and the suspended portion of fin 310 illustrated in FIG. 4A is supported by the buried oxide layer 120 at the ends of fin 310 adjacent source/drain regions.

Figure 4B:
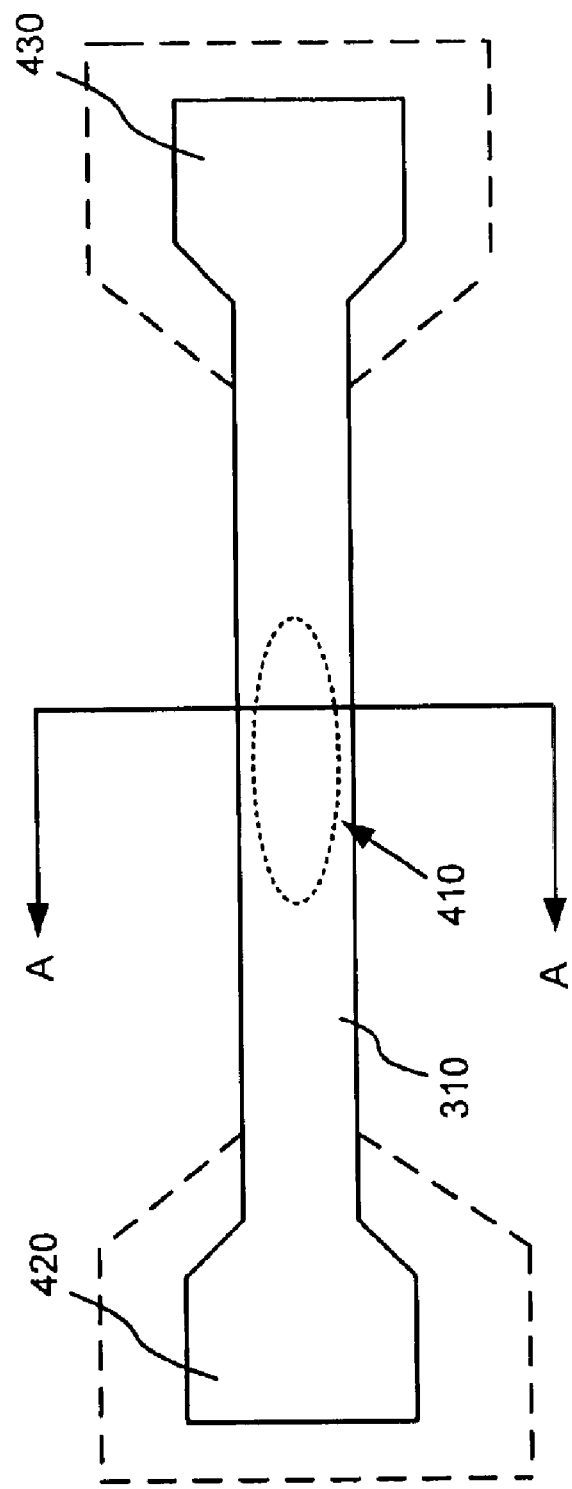
FIG. 4B schematically illustrates the top view of the semiconductor device of FIG. 4A in accordance with an exemplary embodiment of the present invention.

FIG. 4B illustrates a top view of the semiconductor device 100 of FIG. 4A consistent with the present invention. The cross-section illustrated in FIG. 4A is taken along line AA in FIG. 4B. As illustrated in FIG. 4B, semiconductor device 100 includes fin 310, source region 420 and drain region 430. The dielectric layers 140 and 150 are not shown in FIG. 4B for simplicity. The fin 310 is connected to source region 420 and drain region 430 at the respective ends of fin 310. Area 410 in FIG. 4B illustrates the channel region in which the fin 310 is suspended over the buried oxide layer 120, as illustrated in FIG. 4A.

Figure 5:
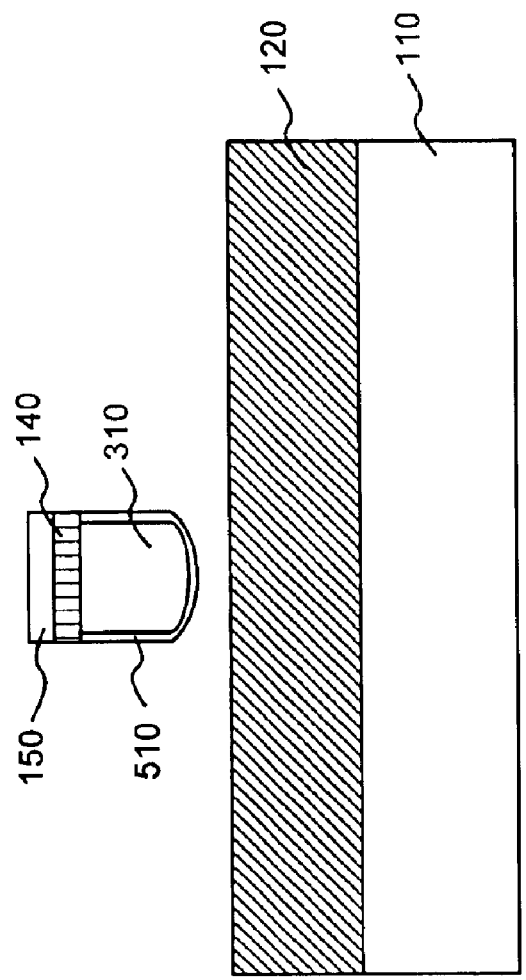
FIG. 5 is a cross-section illustrating the formation of a gate dielectric on the fin of FIG. 4A in accordance with an exemplary embodiment of the present invention.

The photoresist mask 160 may then be removed, as illustrated in FIG. 5. A dielectric layer may then be formed on fin 310. For example, a thin oxide film 510 maybe thermally grown on fin 310, as illustrated in FIG. 5. In an exemplary implementation, the oxide layer 510 may be grown to a thickness of about 8 Å to about 50 Å and may be formed on the exposed silicon side surfaces and bottom surface of fin 310 to act as a gate dielectric layer. Dielectric layer 140 may also form part of the gate dielectric layer. The dielectric cap 150 protects the top surface of fin 310.

Figure 6:
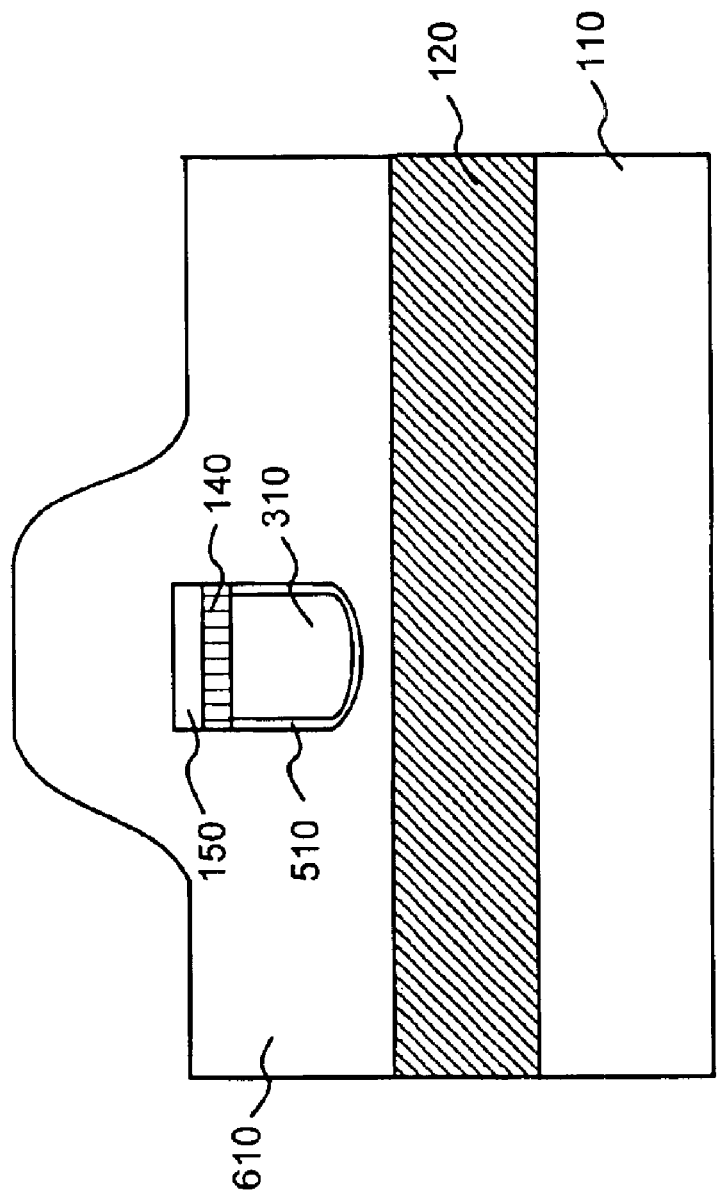
FIG. 6 is a cross-section illustrating the formation of a gate material on the device of FIG. 5 in accordance with an exemplary embodiment of the present invention.

A silicon layer 610 may then be deposited over semiconductor device 100, as illustrated in FIG. 6. The silicon layer 610 may comprise the gate material for the subsequently formed gate electrode. In an exemplary implementation, the silicon layer 610 may include polysilicon deposited using conventional chemical vapor deposition (CVD) to a thickness ranging from about 500 Å to about 2500 Å. Alternatively, other semiconducting materials, such as germanium or combinations of silicon and germanium, or various metals may be used as the gate material.

Figure 7:
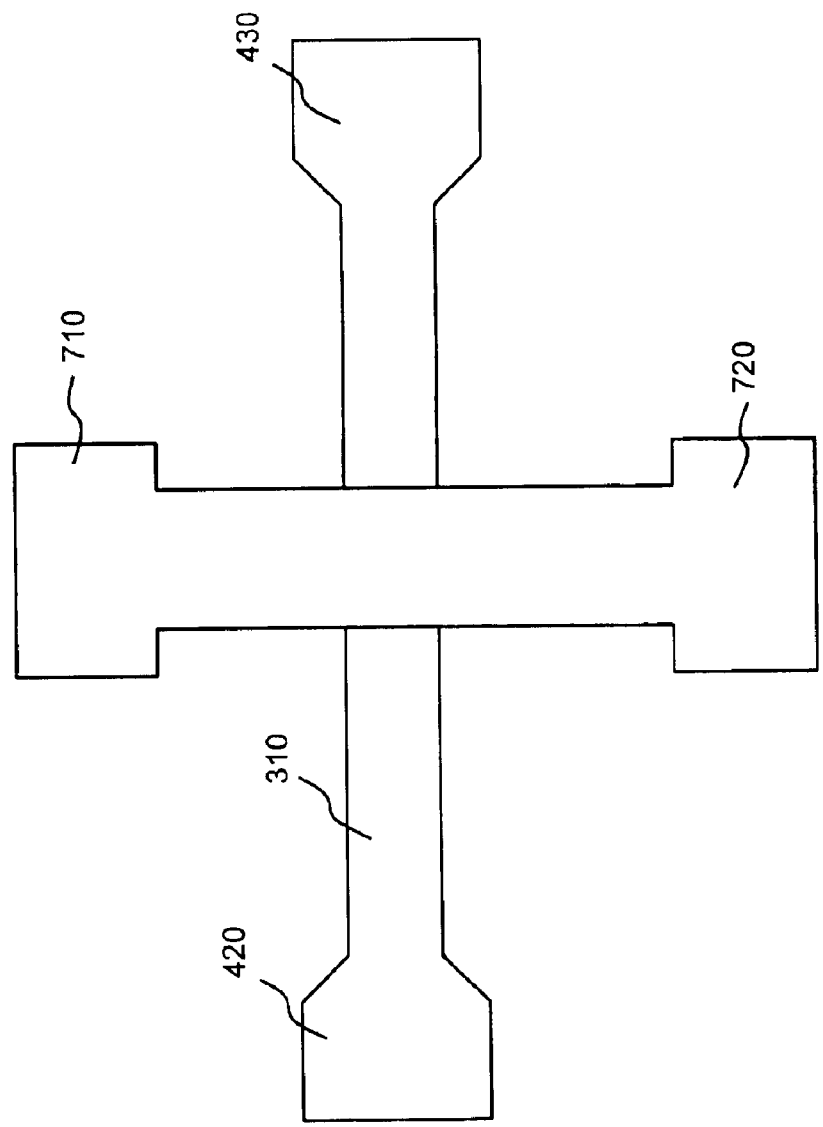
FIG. 7 is a top view illustrating an exemplary double-gate device formed in accordance with an exemplary embodiment of the present invention.

As illustrated in FIG. 6, the silicon layer 610 surrounds the fin 310. That is, silicon layer 610 surrounds the upper surface, side surfaces and bottom surface of fin 310 in the channel region of semiconductor device 100. The silicon layer 610 may then be patterned and etched to form the gate electrode. For example, FIG. 7 illustrates a top view of semiconductor device 100 consistent with the present invention after the gate electrode is formed. As illustrated, semiconductor device 100 includes a double gate structure with gate electrodes 710 and 720 disposed on either side of fin 310. The dielectric layer 510 (FIG. 5) surrounding the side surfaces and bottom surface of fin 310 is not shown in FIG. 7 for simplicity.

The resulting semiconductor device 100 illustrated in FIG. 7 is a double-gate device with a first gate 710 and a second gate 720. The gate material 610 (FIG. 6) surrounds all surfaces of fin 310 in the channel region and provides semiconductor device 100 with increased channel width per device and more flexible device adjustment margins, as compared to a conventional double-gate device. The gate material 610 that covers the top portion of fin 310 and/or the gate material 610 that surrounds the bottom portion of fin 310 may be used as a separate gate in situations where a third or fourth gate may be required.

Figure 8A:
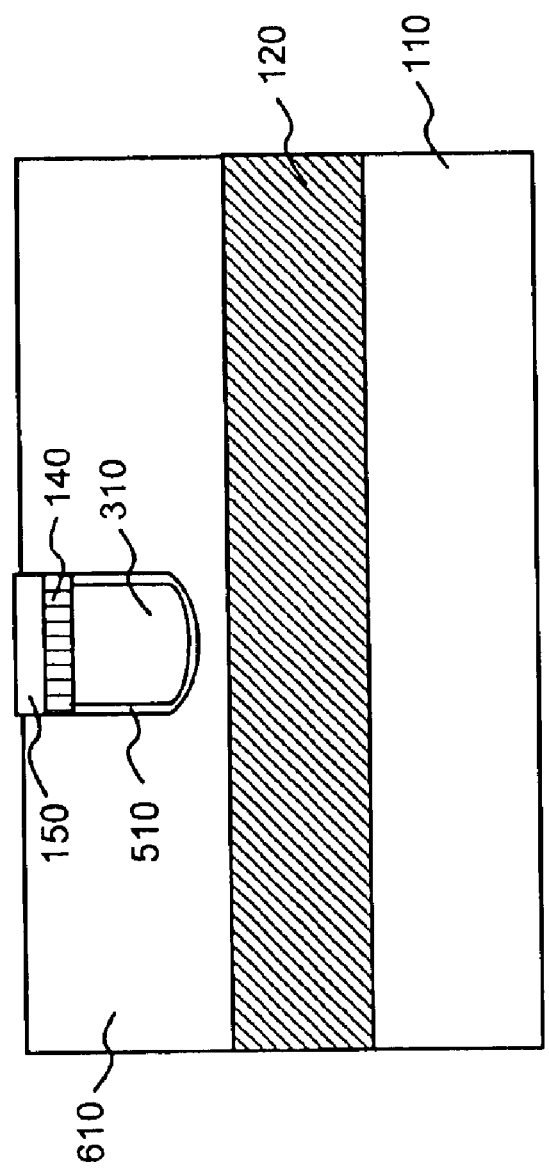
FIG. 8A is a cross-section illustrating the planarizing of the gate material in FIG. 6 in accordance with another embodiment of the present invention.

In alternative implementations consistent with the present invention, the semiconductor device 100 illustrated in FIG. 6 may be planarized. For example, a chemical-mechanical polishing (CMP) may be performed so that the gate material (i.e., silicon layer 610) is even with or nearly even with dielectric layer 150 in the vertical direction, as illustrated in FIG. 8A. In this implementation, the cross-section of semiconductor device 100 in the channel region is U-shaped and the gate material 610 surrounds fin 310 on the two side surfaces and the bottom surface of fin 310.

Silicon layer 610 may then be patterned and etched to form gate electrodes. For example, FIG. 8B illustrates a top view of semiconductor device 100 after the gate electrodes are formed. In this implementation, gate electrodes 710 and 720 may be physically and electrically separated by fin 310 and may be separately biased during operation of semiconductor device 100. Independently biasing the gates increases the flexibility associated with the operation of semiconductor device 100.

In either implementation (FIGS. 6 and 7 or FIGS. 8A and 8B), the source/drain regions 420 and 430 may then be doped. For example, n-type or p-type impurities may be implanted in source/drain regions 420 and 430. The particular implantation dosages and energies may be selected based on the particular end device requirements. One or ordinary skill in this art would be able to optimize the source/drain implantation process based on the circuit requirements and such steps are not disclosed herein in order not to unduly obscure the thrust of the present invention. In addition, sidewall spacers may optionally be formed prior to the source/drain ion implantation to control the location of the source/drain junctions based on the particular circuit requirements. Activation annealing may then be performed to activate the source/drain regions 420 and 430.

Thus, in accordance with the present invention, a double-gate FinFET device is formed with gate material surrounding the fin in the channel region of the device. Advantageously, the resulting structure exhibits good short channel behavior. In addition, the present invention provides increased flexibility and can be easily integrated into conventional processing.

Other Exemplary Embodiments

Figure 9B:
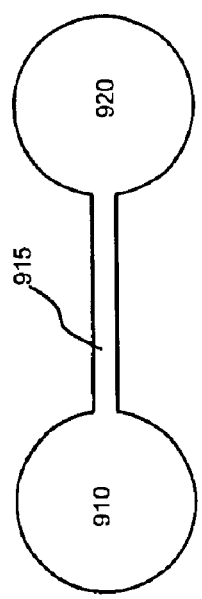
Figure 9A:
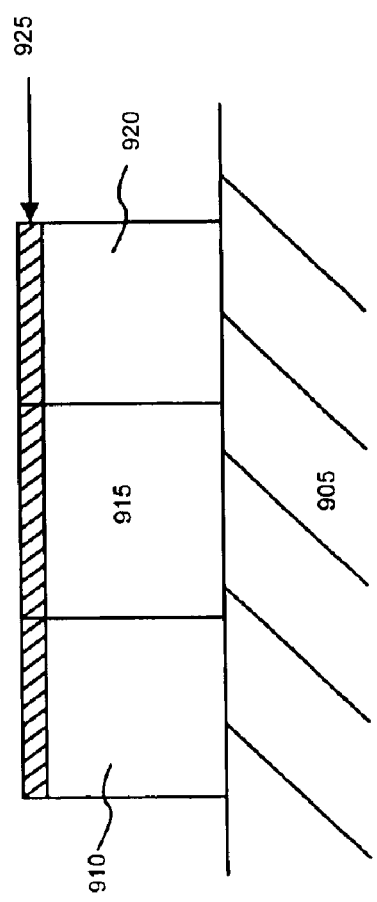

In some implementations, a FinFET may be formed with a damascene gate using a photoresist trim technique. For example, semiconductor device 900 in FIG. 9A may include a buried oxide layer 905 formed on a substrate (not shown). Source region 910, drain region 920 and fin 915 (also referred to as channel 915) are formed on the buried oxide layer 905 and a thin nitride layer 925 may be formed on the source/drain and channel, as illustrated in FIG. 9A. FIG. 9B illustrates the top view of the semiconductor device 900 of FIG. 9A.

Figure 9D:
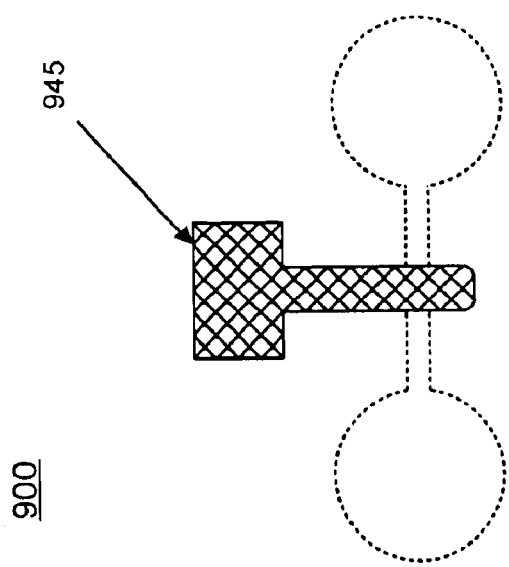
Figure 9C:
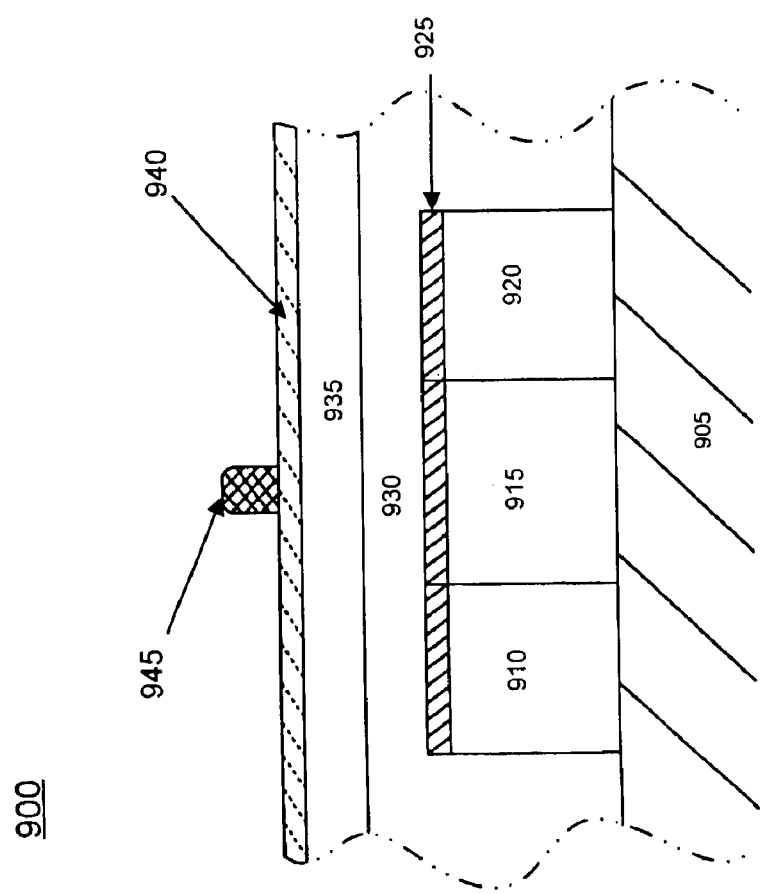

An oxide layer 930 may be deposited over the source/drain and fin and polished to form a relatively flat surface, as illustrated in FIG. 9C. A polysilicon layer 935 may then be deposited over the oxide layer 930, followed by the formation of a thin anti-reflective coating (ARC) layer 940, as illustrated in FIG. 9C. A photoresist material may then be deposited and patterned to form photoresist mask 945, as also illustrated in FIG. 9C. The photoresist mask 945 may be trimmed to a small width to facilitate the formation of a gate with small critical dimensions. FIG. 9D illustrates a top view of the semiconductor device 900 of FIG. 9C.

Figure 9E:
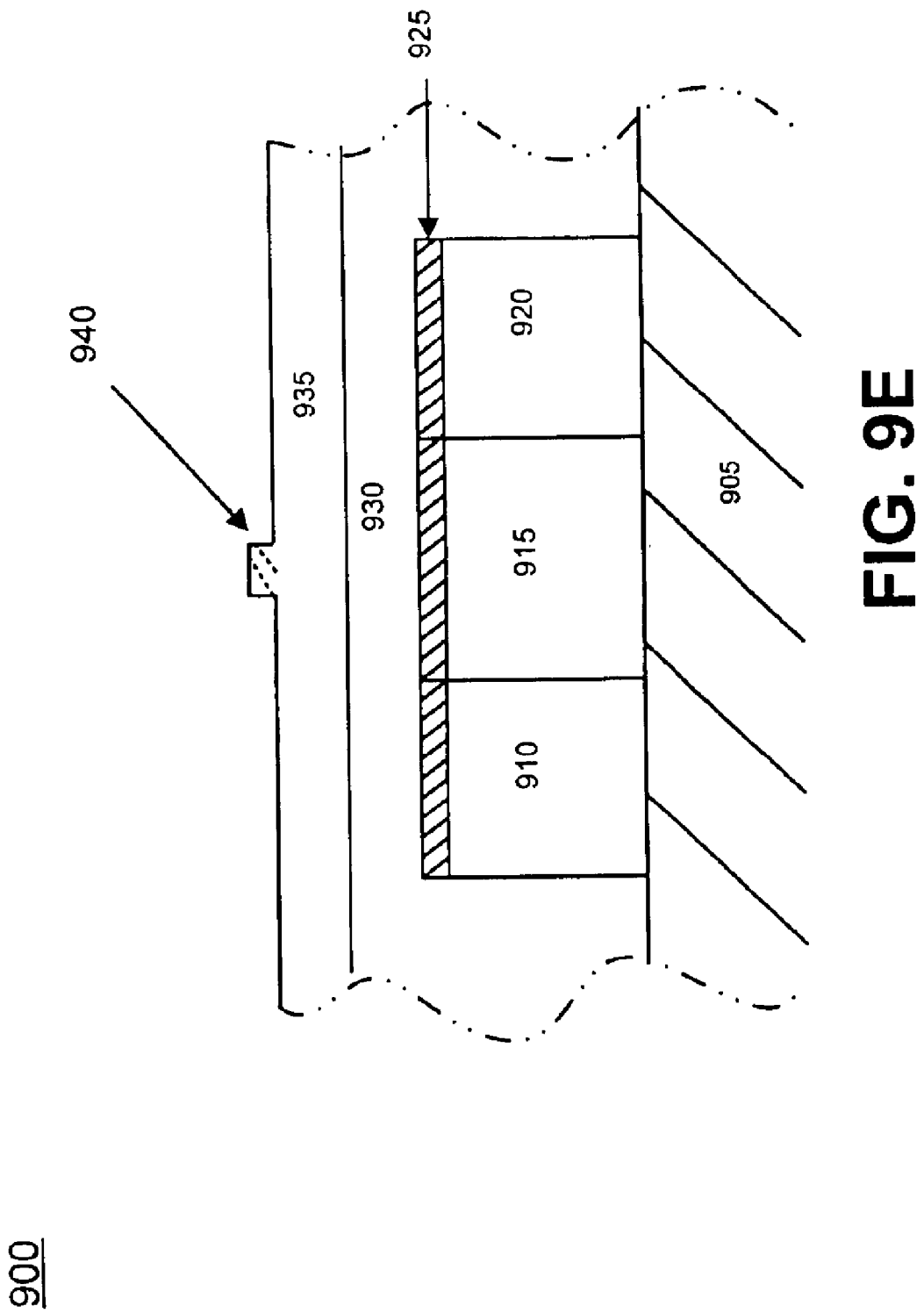

Next, the ARC layer 940 may be etched and the photoresist mask 945 may be removed, as illustrated in FIG. 9E. A thin oxide layer 950 may then be formed on the exposed upper surface of polysilicon layer 935, as illustrated in FIG. 9F. For example, oxide layer 950 may be thermally grown on polysilicon layer 935 to a thickness of about 100 Å. Next, the remaining portion of ARC layer 940 may be stripped, resulting in semiconductor device 900 illustrated in FIG. 9F.

A buff-type polish process may be performed on oxide layer 950, followed by an etching of polysilicon layer 935 to form an opening 955 in the polysilicon layer 935, as illustrated in FIG. 9G. During this procedure, the oxide layer 950 prevents the other portions of polysilicon layer 935 from being etched.

Figure 9I:
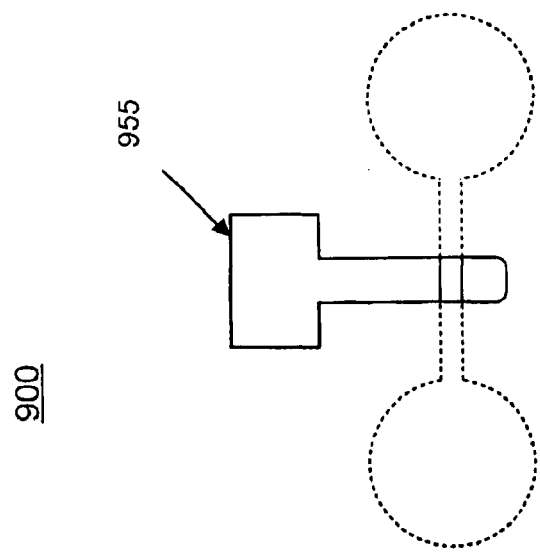
Figure 9H:
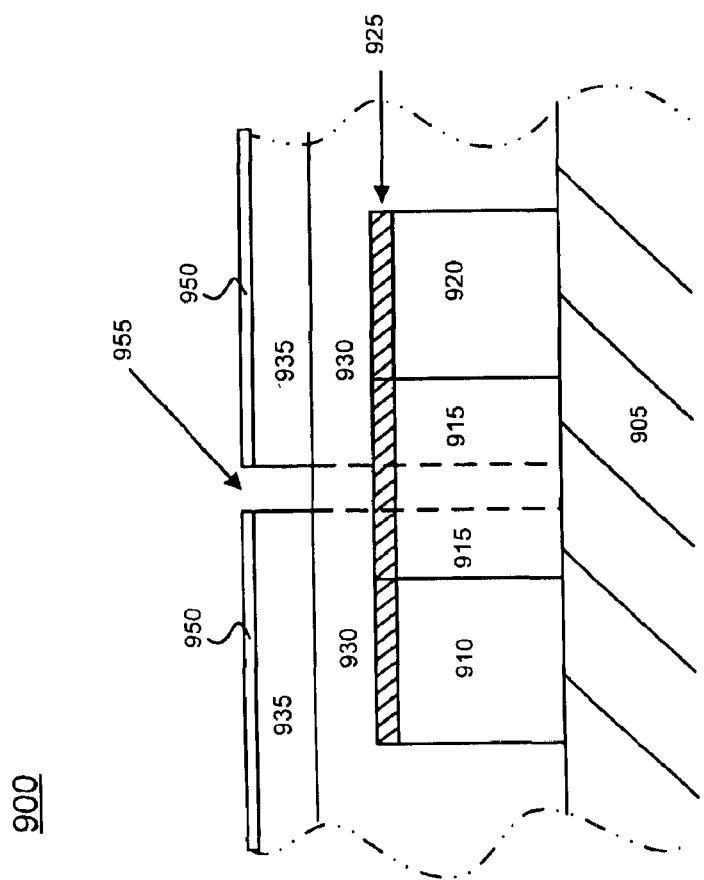

The exposed portion of oxide layer 930 may then be etched with the etching terminating on buried oxide layer 905, as illustrated by the dotted lines in FIG. 9H. The particular etch chemistry used may also be selective to polysilicon and nitrides so that nitride layer 925 and the polysilicon in fin 915 are also etched, as indicated by the dotted lines in FIG. 9H. FIG. 9I illustrates the top view of the semiconductor device 900 of FIG. 9H after the etching.

Figure 9K:
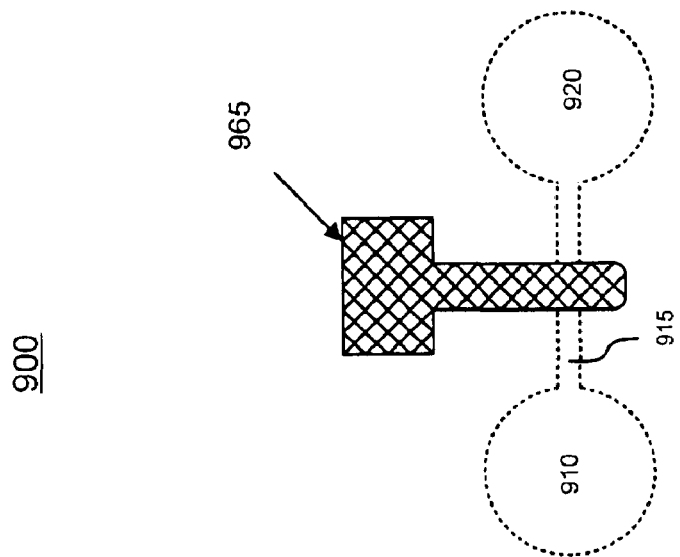
Figure 9J:
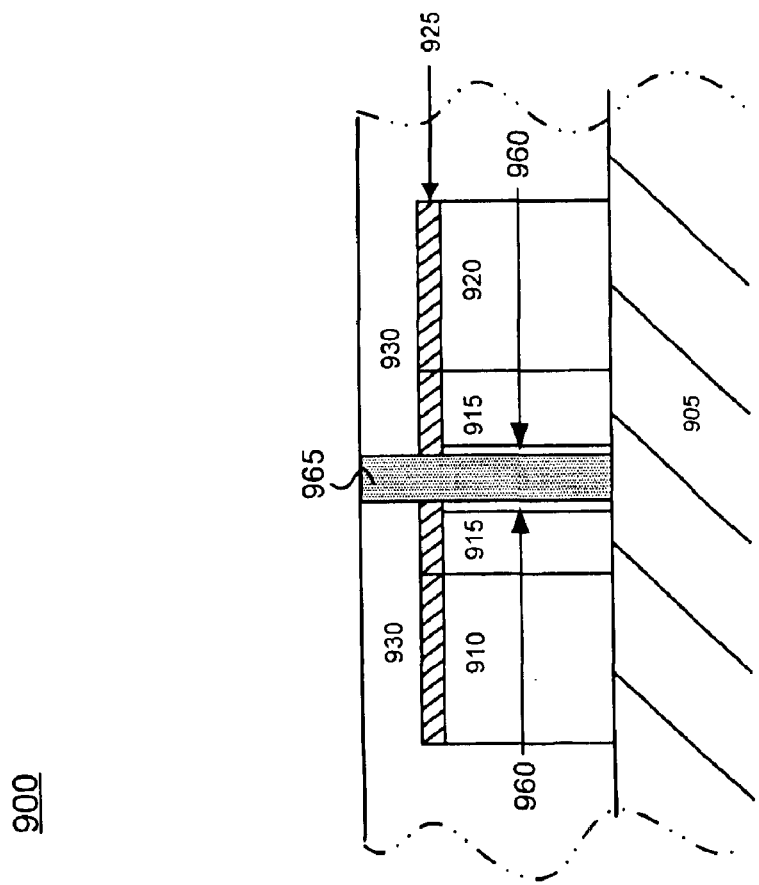

A gate oxide layer 960 may then be grown on the side surfaces of the trench 955 followed by a deposition of a polysilicon layer 965 to fill the trench. The polysilicon layer 965 may then be polished via, for example, a chemical-mechanical polishing, resulting in semiconductor device 900 illustrated in FIG. 9J. The polysilicon material 965 acts as the gate electrode for semiconductor device 900. FIG. 9K illustrates a top view of the semiconductor device 900 of FIG. 9J. Advantageously, the semiconductor device 900 includes a small damascene gate formed by using a photoresist trim technique.

In other exemplary implementations, a FinFET may be formed with a damascene gate having small critical dimensions using a selective polysilicon deposition process. For example, semiconductor device 1000 in FIG. 10A may include a buried oxide layer 1005 formed on a substrate (not shown). Source region 1010, drain region 1020 and fin 1015 (also referred to as channel 1015) are formed on the buried oxide layer 1005 and a thin nitride layer 1025 may be formed on the source/drain and channel, as illustrated in FIG. 10A.

Figure 10A:
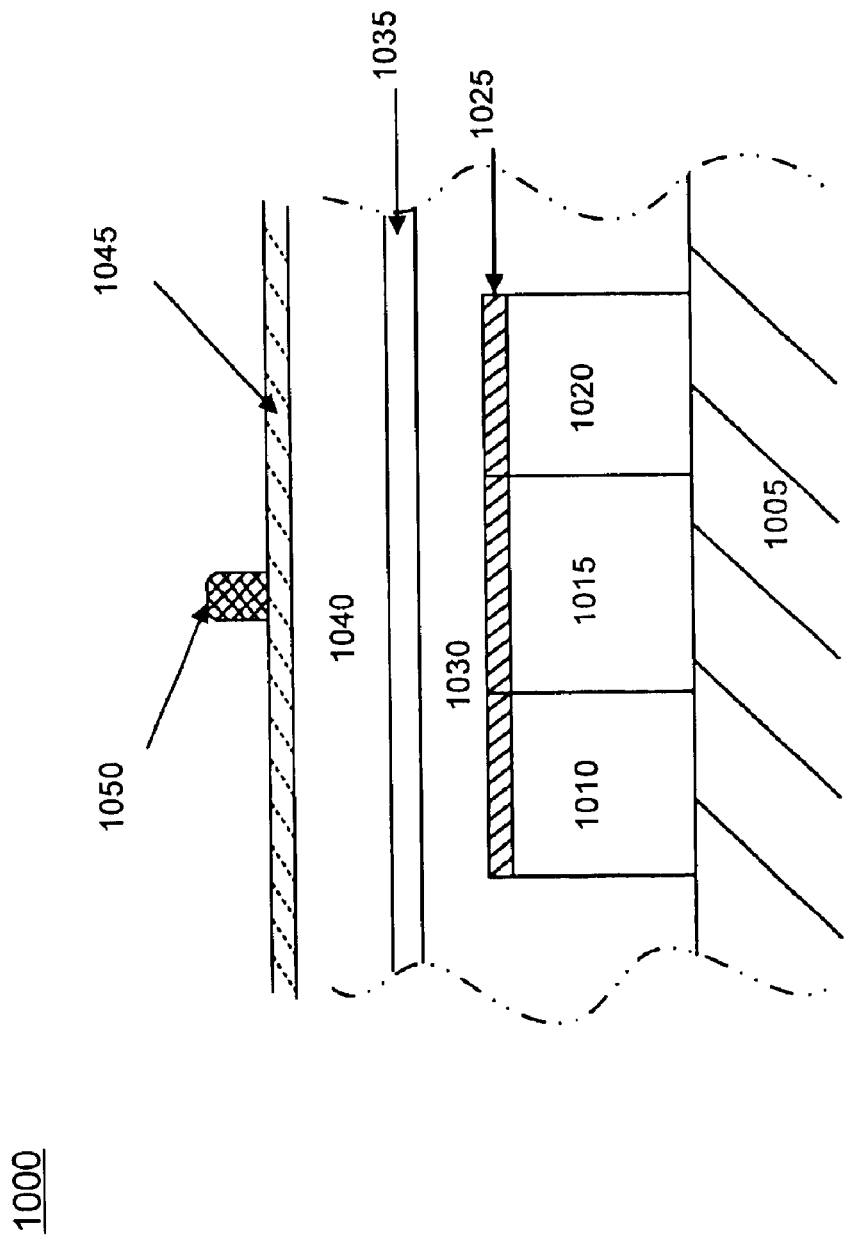
FIGS. 10A–10E are cross-sections illustrating the formation of a damascene gate in accordance with a further embodiment of the present invention.

An oxide layer 1030 may be deposited over the source/drain and fin and polished to form a relatively flat surface, as illustrated in FIG. 10A. A thin polysilicon layer 1035 may then be deposited over the oxide layer 1030, followed by the formation of an oxide layer 1040. An anti-reflective coating (ARC) layer 1045 may be formed over oxide layer 1040, as illustrated in FIG. 10A. A photoresist material may then be deposited and patterned to form photoresist mask 1050, as also illustrated in FIG. 10A. The photoresist mask 1050 may be trimmed to a small width to facilitate formation of a gate with small critical dimensions.

Figure 10B:
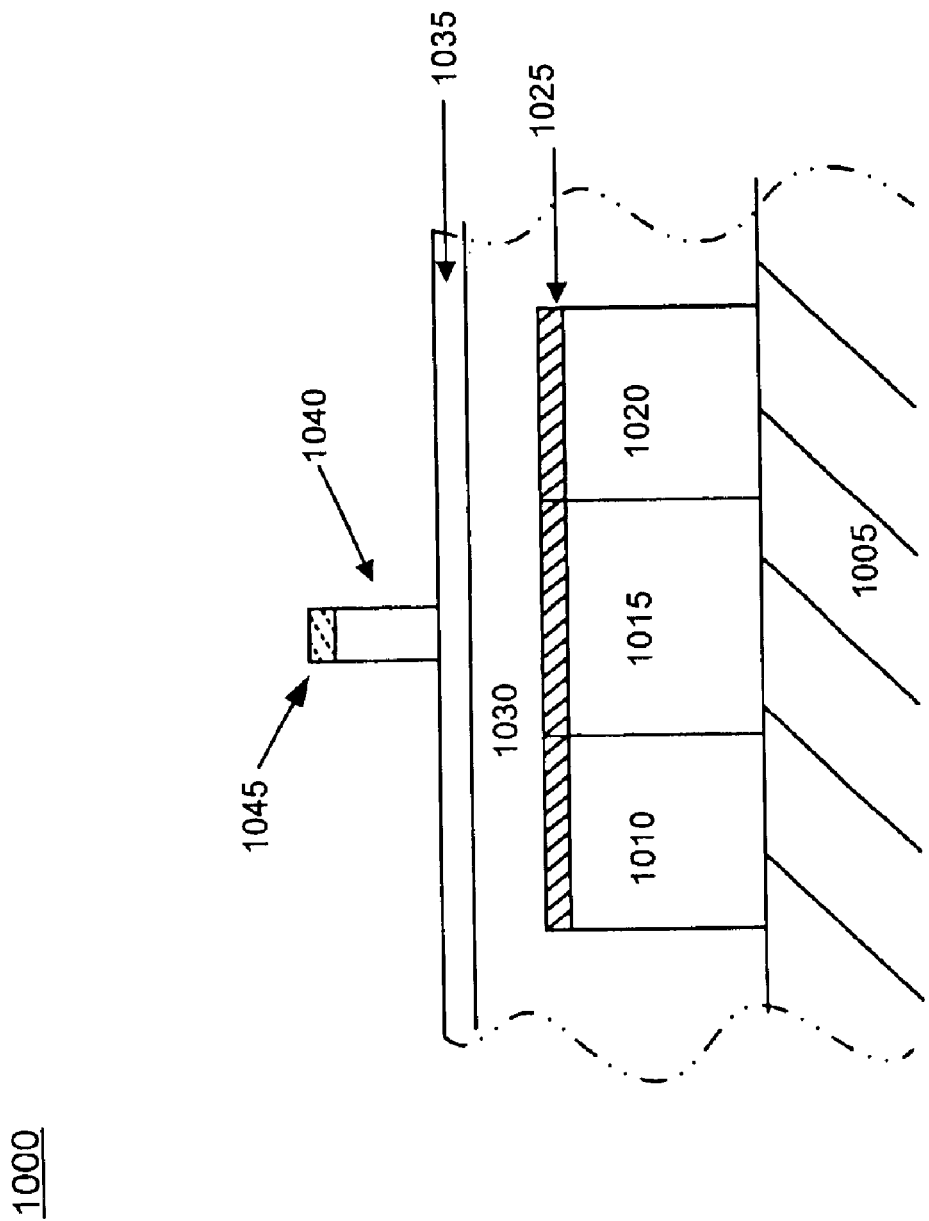
Figure 10C:
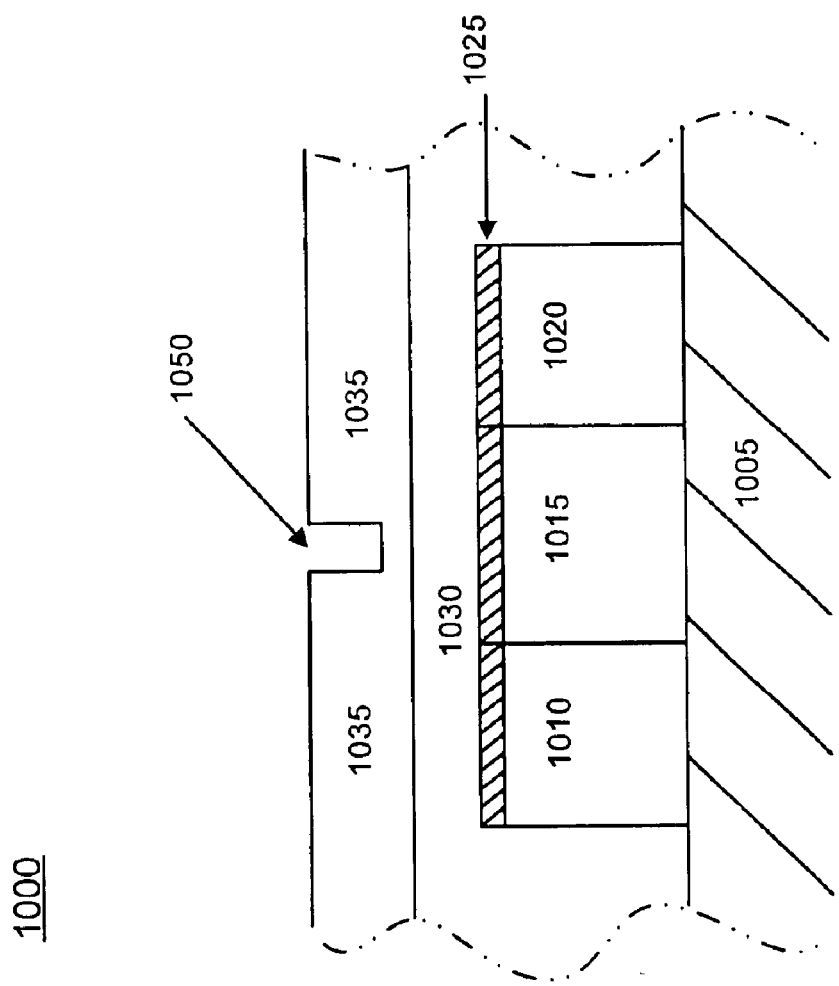

Next, the ARC layer 1045 and oxide layer 1040 may be etched and the photoresist mask 1050 may be removed, as illustrated in FIG. 10B. A selective polysilicon deposition may be performed to increase the thickness of polysilicon layers 1035, as illustrated in FIG. 10C. For example, the thin polysilicon layer 1035 illustrated in FIGS. 10A and 10B may be used as seed layer for a selective epitaxial growth (SEG) process to increase the thickness of polysilicon layer 1035. Semiconductor device 900 may then be polished followed by an oxide dip to remove the remaining portion of ARC layer 1045 and oxide layer 1040, thereby forming trench 1050, as illustrated in FIG. 10C.

Figure 10D:
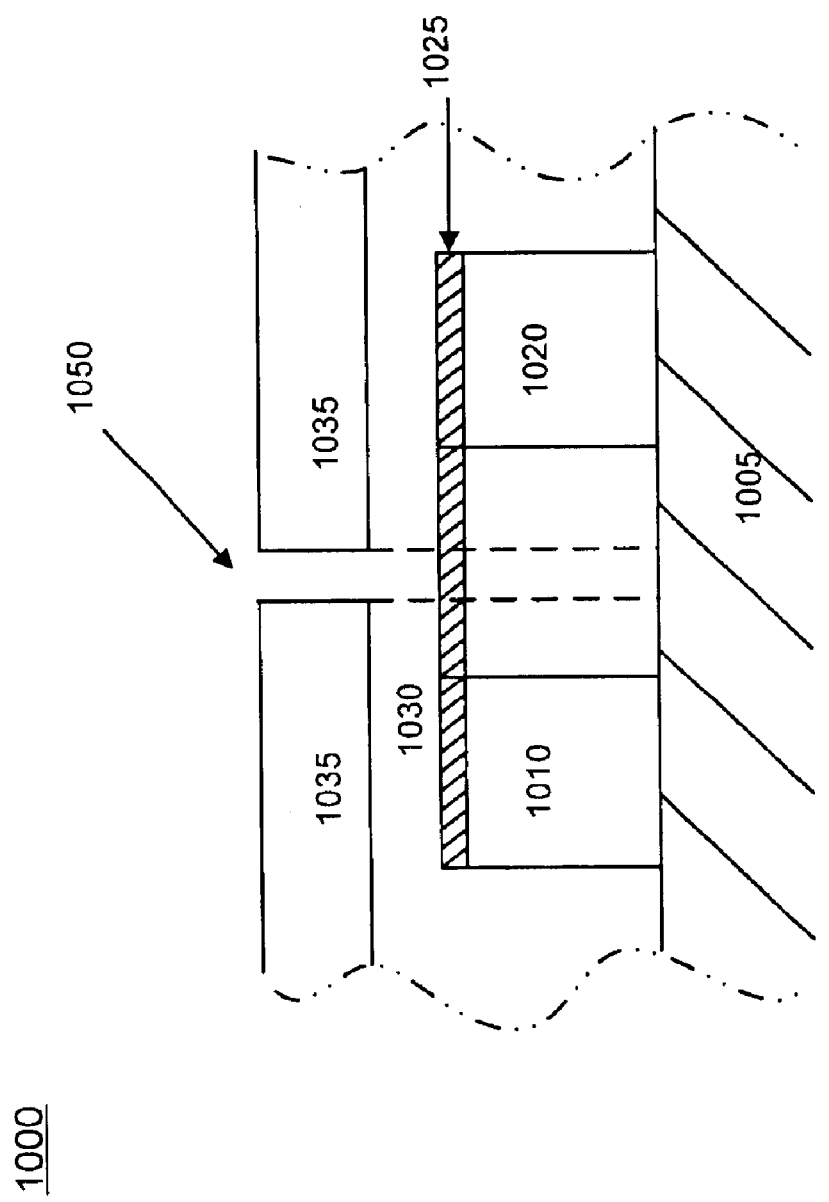

Polysilicon layer 1035 may then be opened in trench 1050 via, for example, etching, to expose oxide layer 1030. The exposed portion of oxide layer 1030 may then be etched with the etching terminating on buried oxide layer 1005, as indicated by the dotted lines in FIG. 10D. The particular etch chemistry used may also be selective to polysilicon and nitrides so that nitride layer 1025 and polysilicon fin 1015 may also be etched, as indicated by the dotted lines in FIG. 10D.

Figure 10E:
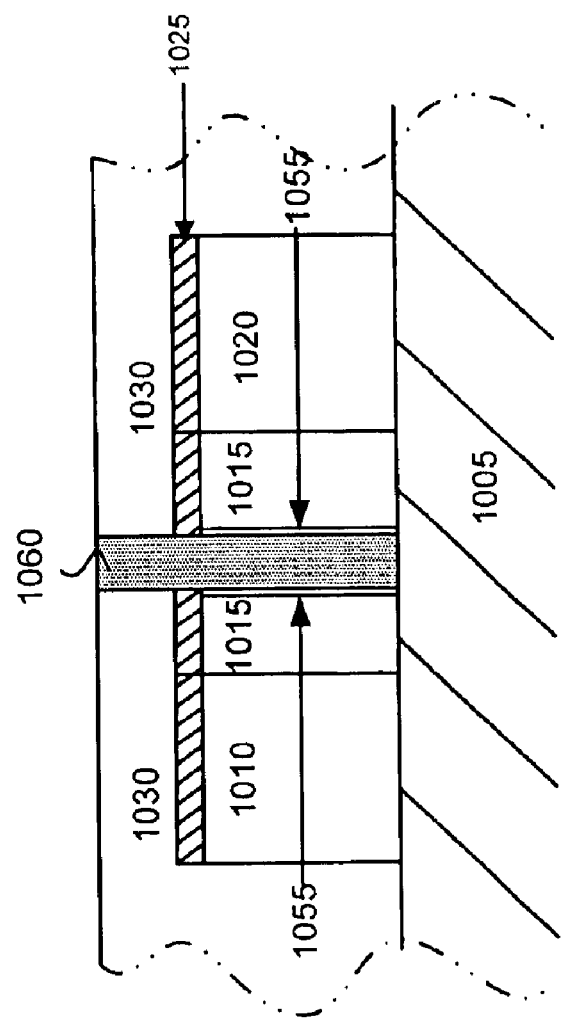

A gate oxide layer 1055 may then be grown on the side surfaces of the silicon fin 1015 in trench 1050, followed by deposition of a polysilicon layer 1060 to fill the trench 1050. The polysilicon layer 1060 may then be polished via, for example, a chemical-mechanical polishing, resulting in semiconductor device 1000 illustrated in FIG. 10E. The polysilicon material 1060 acts as the gate electrode for semiconductor device 1000. Advantageously, the semiconductor device 1000 includes a small damascene gate formed by using a selective polysilicon deposition technique.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of CVD processes, including low pressure CVD (LPCVD) and enhanced CVD (ECVD) can be employed.

The present invention is applicable in the manufacturing of double-gate semiconductor devices and particularly in FinFET devices with design features of 100 nm and below. The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail.

In addition, no element, act, or instruction used in the description of the present application should be construed as critical or essential to the invention unless explicitly described as such, Also, as used herein, the article "a" is intended to include one or more items. Where only one item is intended, the term "one" or similar language is used.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A semiconductor device, comprising:

a substrate;

an insulating layer formed on the substrate;

a fin formed on the insulating layer, the fin having a plurality of side surfaces, a top surface and a bottom surface;

an oxide layer formed over the top surface of the fin;

a nitride layer formed over the oxide layer; and a gate formed on the insulating layer, the gate surrounding the plurality of side surfaces, the top surface and the bottom surface of the fin at a channel region of the semiconductor device.

2. The semiconductor device of claim 1, wherein the gate comprises a first gate electrode disposed on a first side of the fin and a second gate electrode disposed on a second side of the fin opposite the first side.

3. The semiconductor device of claim 2, wherein the gate comprises a third gate electrode surrounding the bottom surface of the fin.

4. The semiconductor device of claim 3, wherein the gate comprises a fourth gate electrode surrounding the top surface of the fin.

5. The semiconductor device of claim 1, further comprising:

a first dielectric layer formed around the plurality of side surfaces and the bottom surface of the fin.

6. The semiconductor device of claim 5, wherein the first dielectric layer has a thickness ranging from about 8 Å to about 50 Å.

7. The semiconductor device of claim 1, wherein the oxide layer has a thickness ranging from about 20 Å to about 400 Å, and the nitride layer has a thickness ranging from about 100 Å to about 800 Å.

8. The semiconductor device of claim 1, further comprising:

a source region and a drain region formed above the insulating layer and adjacent a respective first and second end of the fin, wherein the insulating later comprises a buried oxide layer and the fin comprises at least one of silicon or germanium.

9. A semiconductor device, comprising:

a substrate;

an insulating layer disposed on the substrate;

a conductive fin formed on the insulating layer, the conductive fin having a first end, a second end and a middle portion located between the first and second ends, wherein the first and second ends are disposed on the insulating layer and the middle portion is separated from the insulating layer;

at least one dielectric layer formed over a top surface of the conductive fin;

a gate dielectric layer formed on side surfaces and a bottom surface of the conductive fin; and a gate formed on the insulating layer, the gate surrounding the gate dielectric layer formed on the side surfaces and bottom surface at the middle portion of the conductive fin and covering the at least one dielectric layer formed over the top surface at the middle portion of the conductive fin.

10. The semiconductor device of claim 9, wherein the gate comprises a first gate electrode disposed on a first side of the conductive fin and a second gate electrode disposed on an opposite side of the conductive fin.

11. The semiconductor device of claim 10, wherein the gate further comprises a third gate electrode disposed on a bottom side of the conductive fin.

12. The semiconductor device of claim 11, wherein the gate further comprises a fourth gate electrode disposed on a top side of the conductive fin.

13. The semiconductor device of claim 9, wherein the at least one dielectric layer comprises:

an oxide layer having a thickness ranging from about 20 Å to about 400 Å, and a nitride layer having a thickness ranging from about 100 Å to about 800 Å.

14. The semiconductor device of claim 9, further comprising:

a source region and a drain region formed above the insulating layer and adjacent a respective first and second end of the fin, wherein the gate dielectric layer has a thickness ranging from about 8 Å to about 50 Å.

15. A semiconductor device, comprising:

a substrate;

an insulating layer formed on the substrate;

a fin formed on the insulating layer, the fin having a plurality of side surfaces, a top surface and a bottom surface;

a dielectric layer formed around the plurality of side surfaces and the bottom surface of the fin, the dielectric layer having a thickness ranging from about 20 Å to about 50 Å; and a gate formed on the insulating layer, the gate surrounding the plurality of side surfaces, the top surface and the bottom surface of the fin at a channel region of the semiconductor device.

16. The semiconductor device of claim 15, further comprising:

an oxide layer formed over the top surface of the fin; and a nitride layer formed over the oxide layer.

17. The semiconductor device of claim 15, further comprising:

a source region and a drain region formed above the insulating layer and adjacent a respective first and second end of the fin, wherein the insulating later comprises a buried oxide layer and the fin comprises at least one of silicon or germanium.

18. The semiconductor device of claim 15, wherein the gate comprises a first gate electrode disposed on a first side of the fin and a second gate electrode disposed on a second side of the fin opposite the first side.

* * * * *

UNITED STATES PATENT AND TRADEMARK OFFICE
CERTIFICATE OF CORRECTION

PATENT NO. : 6,960,804 B1
DATED : November 11, 2005
INVENTOR(S) : Chih-Yuh Yang

It is certified that error appears in the above-identified patent and that said Letters Patent is hereby corrected as shown below:

Title page,
Item [73], Assignee, should read -- Advanced Micro Devices, Inc., Sunnyvale, CA. --.
Item [74], *Attorney, Agent, or Firm*, should read -- Harrity & Snyder, LLP --.

Signed and Sealed this

Seventeenth Day of January, 2006

JON W. DUDAS
*Director of the United States Patent and Trademark Office*

UNITED STATES PATENT AND TRADEMARK OFFICE
CERTIFICATE OF CORRECTION

PATENT NO. : 6,960,804 B1
DATED : November 1, 2005
INVENTOR(S) : Chih-Yuh Yang

It is certified that error appears in the above-identified patent and that said Letters Patent is hereby corrected as shown below:

Title page,
Item [73], Assignee, should read -- Advanced Micro Devices, Inc., Sunnyvale, CA. --.
Item [74], *Attorney, Agent, or Firm*, should read -- Harrity & Snyder, LLP --.

This certificate supersedes Certificate of Correction issued January 17, 2006.

Signed and Sealed this

Twenty-first Day of February, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,960,804 B1 | Page 1 of 1 |
| APPLICATION NO. | : 10/633034 | |
| DATED | : November 1, 2005 | |
| INVENTOR(S) | : Chih-Yuh Yang et al. | |

It is certified that error appears in the above-identified patent and that said Letters Patent is hereby corrected as shown below:

On the front page, the application filing date should be --August 4, 2003-- and not "October 10, 2003".

At column 3, line 44, delete the period after the word "silicon".

Claim 8, line 5 (column 9, line 42), change the word "later" to --layer--.

Claim 17, line 5 (column 10, line 52), change the word "later" to --layer--.

Signed and Sealed this

Twenty-sixth Day of June, 2007

JON W. DUDAS
*Director of the United States Patent and Trademark Office*